United States Patent
Boldt

(10) Patent No.: US 7,266,038 B2
(45) Date of Patent: Sep. 4, 2007

(54) METHOD FOR ACTIVATING AND DEACTIVATING ELECTRONIC CIRCUIT UNITS AND CIRCUIT ARRANGEMENT FOR CARRYING OUT THE METHOD

(75) Inventor: Sven Boldt, Aschheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/133,038

(22) Filed: May 19, 2005

(65) Prior Publication Data
US 2006/0170408 A1    Aug. 3, 2006

(30) Foreign Application Priority Data
May 27, 2004  (DE) ............... 10 2004 025 899

(51) Int. Cl.
*G11C 8/00* (2006.01)
(52) U.S. Cl. ............... 365/230.06; 365/230.01; 365/230.03; 365/230.09; 365/233
(58) Field of Classification Search ........... 365/230.06, 365/230.01, 230.03, 230.09, 233
See application file for complete search history.

(56) References Cited

U.S. PATENT DOCUMENTS

| | | | | |
|---|---|---|---|---|
| 4,038,642 A | * | 7/1977 | Bouknecht et al. ............ 710/20 |
| 4,079,452 A | * | 3/1978 | Larson et al. ................. 710/11 |
| 4,398,243 A | * | 8/1983 | Holberger et al. ........... 712/211 |
| 4,545,010 A | * | 10/1985 | Salas et al. ..................... 711/5 |
| 4,978,953 A | * | 12/1990 | Hauge ........................ 340/2.26 |
| 5,115,437 A | * | 5/1992 | Welles et al. ................ 714/733 |
| 5,257,235 A | * | 10/1993 | Miyamoto ............. 365/230.03 |
| 5,467,468 A | * | 11/1995 | Koshikawa ................. 714/726 |
| 5,512,846 A | * | 4/1996 | Hori ........................... 326/105 |
| 5,631,848 A | * | 5/1997 | Laczko et al. .............. 708/203 |
| 5,706,407 A | * | 1/1998 | Nakamura et al. .......... 700/251 |
| 5,758,056 A | * | 5/1998 | Barr ............................... 714/7 |
| 5,826,068 A | * | 10/1998 | Gates ......................... 713/600 |
| 5,941,974 A | * | 8/1999 | Babin ......................... 710/316 |
| 6,175,891 B1 | * | 1/2001 | Norman et al. ................ 711/5 |
| 6,199,151 B1 | * | 3/2001 | Williams et al. ............ 711/203 |
| 6,259,647 B1 | * | 7/2001 | Ooishi ................... 365/230.01 |
| 6,310,596 B1 | * | 10/2001 | Takasugi ..................... 345/98 |
| 6,334,123 B1 | * | 12/2001 | Ross et al. ..................... 707/2 |
| 6,442,058 B2 | * | 8/2002 | Mori .......................... 365/103 |

FOREIGN PATENT DOCUMENTS

JP   10 2004 020 038 A1   12/2004

OTHER PUBLICATIONS

Koch, J. "Serielle 12C-Bus-Schnittstelle bei der Mikrocomputer-Familie 8400," *Valvo Technische Information 812215*, p. 13, 1984.
Nührmann, D., "Das große Werkbuch Electronik ist 20 Jahre alt," 7. Auflage, Poing, Franzis-Verlag, pp. 3772-2779, 1998, ISBN 3-7723-6547-7.
Philips Semiconductors, The I²C-Bus Specification, Version 2.1, p. 15-16, Jan. 2000.
German Office Action dated Apr. 21, 2005.

* cited by examiner

*Primary Examiner*—Viet Q. Nguyen
(74) *Attorney, Agent, or Firm*—Jenkins, Wilson, Taylor & Hunt, P.A.

(57) ABSTRACT

The invention provides an electronic circuit arrangement having an electronic circuit module (100) constructed from one or more electronic circuit units (101*a*-101*n*), a select signal generating unit (105) for generating a select signal (103), and a connecting line (106) for connecting each electronic circuit unit (101*a*-101*n*) to the select signal generating unit (105), each of the electronic circuit units (101*a*-101*n*) of the electronic circuit module (100) furthermore in each case having a decoder unit (107*a*-107*n*) for decoding a predetermined bit sequence (108) of the select signal (103), at least one electronic circuit unit (101*a*-101*n*) being selectively selected by means of the predetermined bit sequence (108) of the select signal (103).

11 Claims, 2 Drawing Sheets

METHOD FOR ACTIVATING AND DEACTIVATING ELECTRONIC CIRCUIT UNITS AND CIRCUIT ARRANGEMENT FOR CARRYING OUT THE METHOD

TECHNICAL FIELD

The present invention generally relates to circuit modules, such as, for example, memory modules, which are constructed from individual circuit units such as, for example, memory chips.

BACKGROUND ART

Specifically, the present invention relates to an electronic circuit arrangement having an electronic circuit module constructed from one or more electronic circuit units, the electronic circuit units in each case having a control input terminal for activating or deactivating the relevant electronic circuit unit by means of a select signal and a drive line assigned to each electronic circuit unit and serving for feeding the select signal to each electronic circuit unit. A select signal generating unit for generating the select signal and a connecting line for connecting each electronic circuit unit to the select signal generating unit are furthermore provided.

FIG. 2 shows a conventional electronic circuit module M constructed from individual electronic chips BS1, BS2, BS3, . . . BSn. The chips BS1-BSn are constructed as memory chips, for example, which in their entirety form a memory module.

Such integrated circuit modules with memory chips are currently of great importance for data storage. The increasing demand for larger storage capacities requires ever more chips to be accommodated in a single module M.

In a conventional manner, each chip BS1-BSn is driven or activated/deactivated via a dedicated drive line L1, L2, L3 . . . Ln. Such activation/deactivation lines are led to a specific terminal of each chip, the so-called chip select terminal CS1, CS2, CS3 . . . CSn (CS="Chip-Select"). If an activation signal (also referred to as select signal) is applied to a chip select input of a chip, then all remaining terminal pins are activated in this chip.

One disadvantage of the conventional circuit arrangement as is shown by way of example in FIG. 2 is that each chip select terminal has to be routed via a separate line to outside the memory module M in order to be respectively accessible via a terminal A1, A2, A3 . . . An. Consequently, the memory module disadvantageously has to have a large number of lines L1-Ln and a corresponding number of input terminals E1, E2, E3, . . . En in order that each chip BS1-BSn can actually be addressed separately. Against the background of an increasing demand for storage capacities, more and more electronic chips BS1-BSn that are designed as memory chips, for example, are necessary.

Since the space requirement of a circuit arrangement of this type is not permitted to increase substantially, the need arises to route a drive line L1-Ln out of the module M in each case for each individual chip BS1-BSn, a major problem with regard to wiring complexity and space requirement. Particularly in the case of complex circuit arrangements with the electronic chips BS1-BSn designed in a stacked construction, it is extremely disadvantageous that the corresponding select signal has to be fed to the module M separately for each individual chip BS1-BSn via separate lines L1-Ln.

SUMMARY OF THE INVENTION

Therefore, it is an object of the present invention to specify an electronic circuit arrangement having electronic circuit modules constructed from electronic circuit units in which a space requirement and a number of drive lines are reduced.

This object is achieved according to the invention by means of a circuit arrangement having the features of claim 1.

Furthermore, this object is achieved by means of a method for activating and deactivating electronic circuit units which is specified in Patent claim 5.

Further refinements of the invention emerge from the subclaims.

One essential concept of the invention consists in providing only a single drive line designed as a connecting line for all of the electronic circuit units accommodated in a circuit module, and in providing a selection of one or more specific circuit units of the memory module by a coding by means of a bit sequence of a select signal.

This affords the advantage that the number of connecting lines in an electronic memory module is considerably reduced. It is furthermore advantageous that a number of electronic circuit units that can be connected to a connecting line can be increased depending on a bit sequence provided by the select signal. The heart of the invention consists in providing a logic circuit which is provided as a decoder unit and is integrated into each electronic circuit unit of the electronic memory module. The decoder unit of each electronic circuit unit ensures that the relevant circuit unit inherently accepts only that information of the select signal which is intended for the corresponding electronic circuit unit. In this way, all select signals for all electronic circuit units of the electronic memory module can be fed via a single connecting line that is accessible at a select signal input terminal of the electronic circuit module.

Furthermore, one advantage of the circuit arrangement according to the invention consists in the fact that the electronic circuit units arranged in an electronic circuit module can be stacked in a simple manner as a result of the omission of additional select lines. The circuit arrangement according to the invention furthermore expediently permits the addressing, i.e. activation or deactivation, of individual subgroups of electronic circuit units in the electronic circuit module.

The circuit arrangement according to the invention essentially has:

a) an electronic circuit module constructed from one or more electronic circuit units, the electronic circuit units in each case having:

a1) a control input terminal for activating or deactivating the electronic circuit unit by means of a select signal; and a2) a drive line assigned to each electronic circuit unit and serving for feeding the select signal to each electronic circuit unit;

b) a select signal generating unit for generating the select signal; and c) a connecting line for electrically connecting each electronic circuit unit to the select signal generating unit, each of the electronic circuit units of the electronic circuit module furthermore in each case having a decoder unit for decoding a predetermined bit sequence of the select signal, at least one electronic circuit unit being selectively selected by means of the predetermined bit sequence of the select signal.

Furthermore, the method according to the invention for activating and deactivating electronic circuit units arranged in an electronic circuit module essentially has the following steps of:

a) generating, by means of a select signal generating unit, a select signal for selecting one or more electronic circuit units of the electronic circuit module;

b) feeding the select signal, via a drive line assigned to each electronic circuit unit, to a control input terminal—provided in each electronic circuit unit—for activating or deactivating the electronic circuit unit, the select signal for selecting one or more electronic circuit units of the electronic circuit module being fed to each electronic circuit unit by the select signal generating unit equally via a common connecting line; and c) a predetermined bit sequence of the select signal is decoded in each electronic circuit unit of the electronic circuit module by means of a decoder unit assigned to the electronic circuit unit, at least one electronic circuit unit being selectively selected by means of the predetermined bit sequence of the select signal.

Advantageous developments and improvements of the respective subject-matter of the invention are found in the subclaims.

In accordance with one preferred development of the present invention, the electronic circuit units of the electronic circuit module form a dynamic random access memory (DRAM).

In accordance with a further preferred development of the present invention, the electronic circuit units of the electronic circuit module have a stacked construction, in such a way that the electronic circuit module can preferably be designed in a stacked fashion.

In accordance with yet another preferred development of the present invention, the connecting line is provided as a 1-bit wide data bus. Preferably, a coding of up to 16 different electronic circuit units to be driven in the circuit module is made possible via the 1-bit wide data bus, a 4-bit coding being effected.

In accordance with yet another preferred development of the present invention, all or a predeterminable group of electronic circuit units connected to the connecting line are deactivated in the absence of the select signal.

In accordance with yet another preferred development of the present invention, all or a predeterminable group of electronic circuit units of the electronic circuit module connected to the connecting line are activated or deactivated jointly by means of a master bit of the bit sequence of the select signal.

In accordance with yet another preferred development of the present invention, each electronic circuit unit of the electronic circuit module that is to be activated or deactivated is assigned a unique address.

In accordance with yet another preferred development of the present invention, each of the electronic circuit units of the electronic circuit module undergoes transition to an active operating state only when it is fed a corresponding select signal.

In accordance with yet another preferred development of the present invention, an activation of an activated electronic circuit unit is maintained until a renewed activation or deactivation of the electronic circuit units of the electronic circuit module is effected by means of the select signal.

In accordance with yet another preferred development of the present invention, activation or deactivation operations of the electronic circuit units of the electronic circuit module are performed at time intervals that correspond to a predeterminable number of clock cycles. The predetermined number of clock cycles is preferably four.

In accordance with yet another preferred development of the present invention, when no select signal is applied to the select signal input terminal of the electronic circuit module, the entire electronic circuit module is deactivated.

Exemplary embodiments of the invention are illustrated in the drawing and are explained in more detail in the description below.

DETAILED DESCRIPTION OF THE INVENTION

In the figures, identical reference symbols designate identical or functionally identical components or steps.

Figure 1:
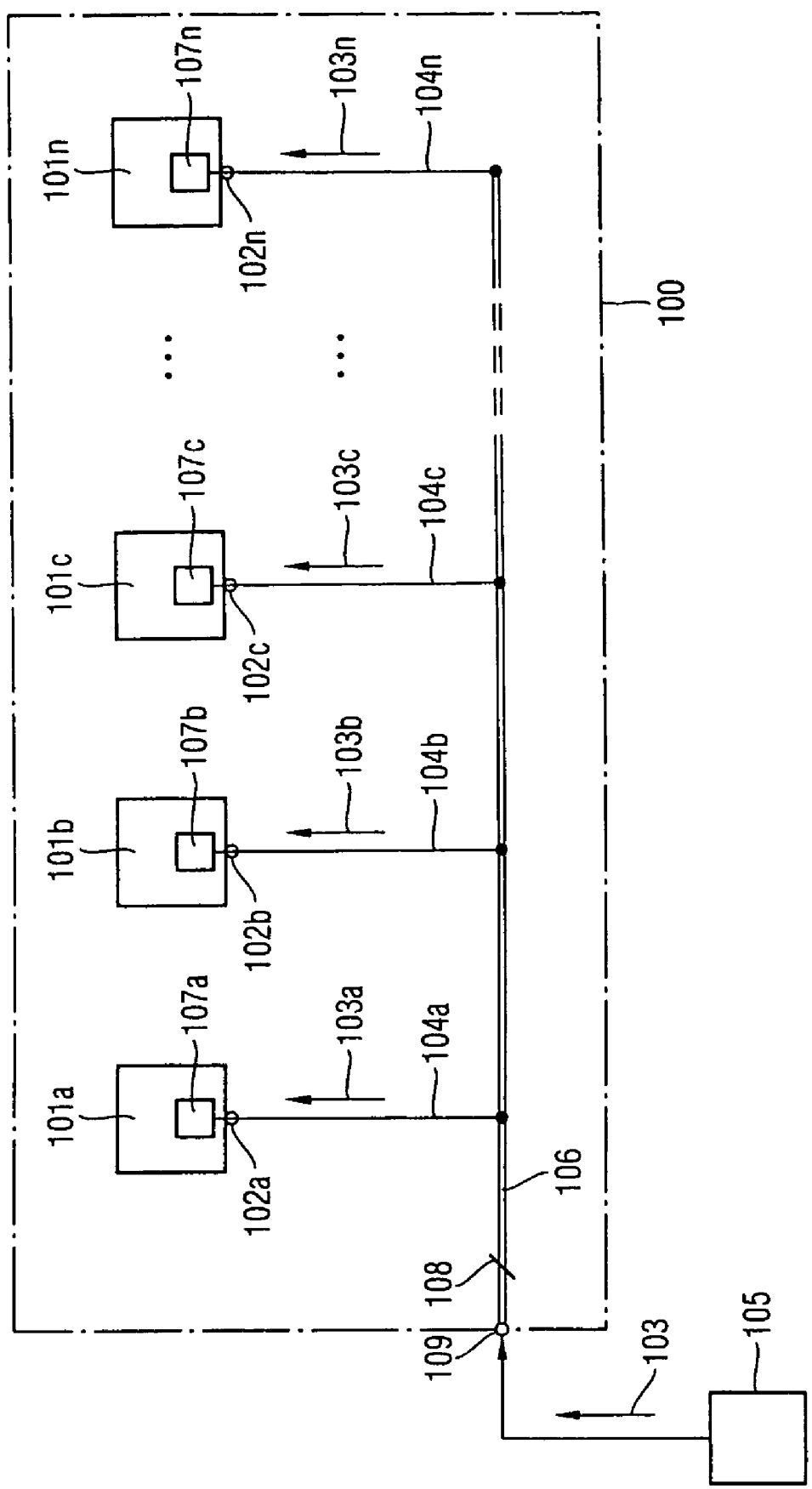
FIG. 1 shows a circuit arrangement having an electronic circuit module formed from individual electronic circuit units, in accordance with a preferred exemplary embodiment of the present invention.

FIG. 1 shows a schematic block diagram of an electronic circuit arrangement having an electronic circuit module 100.

A select signal 103 is applied to the electronic circuit module 100 via a single select signal input terminal 109. The select signal 103 is generated in a select signal generating unit 105 and fed in parallel to circuit units 101$a$-101$n$ arranged in the electronic circuit module 100. The circuit units 101$a$-101$n$ arranged in the electronic circuit module together map a desired circuit function of the electronic circuit module 100; by way of example, the electronic circuit units 101$a$-101$n$ of the electronic circuit module 100 are designed as a dynamic random access memory DRAM.

In order to selectively address a specific electronic circuit unit 101$a$-101$n$, a corresponding select signal 103$a$-103$n$ is to be fed to said electronic circuit unit 101$a$-101$n$. When such a signal is applied to a "chip select" input (not shown) of the electronic circuit unit 101$a$-101$n$, all remaining terminal units (pins) of the electronic circuit unit 101$a$-101$n$ are activated. In this way, the specific electronic circuit unit 101$a$-101$n$ is activated by application of the select signal 103$a$-103$n$. In order to be able to address all electronic circuit units 101$a$-101$n$ via a single connecting line 106, a coding of the select signal 103 is necessary. According to the invention, this coding of the select signal 103 is effected by means of a predeterminable bit sequence 108; by way of example, the connecting line 106 is designed as a 1-bit wide data bus, whereby a bit sequence of four serial bits can be transmitted in parallel to the individual circuit units 101$a$-101$n$.

According to the invention, the electronic circuit units 101$a$-101$n$ of the circuit module 100 in each case have a decoder unit 107$a$-107$n$. The decoder unit may be embodied as a corresponding logic circuit which can decode a bit sequence 108 fed in via the connecting line 106.

A bit sequence in accordance with a preferred exemplary embodiment of the present invention is illustrated in Table 1 below.

TABLE 1

| Circuit unit | Bit sequence 108 | | | | |
|---|---|---|---|---|---|
| | Bit 1 Master bit 110 | Bit 2 | Bit 3 | Bit 4 | Bit 5 |
| None | 0 | 0 | 0 | 0 | 0 |
| 101a | 0 | 0 | 0 | 0 | 1 |
| 101b | 0 | 0 | 0 | 1 | 0 |
| 101c | 0 | 0 | 0 | 1 | 1 |
| 101d | 0 | 0 | 1 | 0 | 0 |
| 101e | 0 | 0 | 1 | 0 | 1 |
| 101f | 0 | 0 | 1 | 1 | 0 |
| 101g | 0 | 0 | 1 | 1 | 1 |
| 101h | 0 | 1 | 0 | 0 | 0 |

As shown in Table 1 above, it is possible, by means of the bit sequence 108 comprising four bits (Bit2 to Bit5) and a master bit 110 (Bit1), to address the eight different electronic circuit units 101a-101h shown in Table 1. The decoder units 107a-107n of the electronic circuit units 101a-101n thus have the task of decoding a corresponding binary signal. The individual electronic circuit units 101a-101n are fed the bit sequences in each case via a drive line 104a-104n which is respectively connected to a control input terminal 102a-102n of the corresponding electronic circuit unit 101a-101n.

As shown in Table 1 above, a binary number "1" corresponds to a driving of the electronic circuit unit 101a, a binary number "100" corresponds for example to an electronic circuit unit 101d to be driven, and a binary number "111" corresponds to an electronic circuit unit 101g to be driven. A specific electronic circuit unit 101a-101h of the circuit module 100 can be activated or deactivated only when the corresponding binary number matches the address specified for the electronic circuit unit 101a-101h. In one aspect of the invention, all or a predeterminable group of electronic circuit units 101a-10n connected to the connecting line 106 are deactivated in the absence of all select signals 103a-103n.

It is furthermore possible, by means of a master bit 110 of the bit sequence 108 of the select signal 103, to jointly activate or deactivate all or a predeterminable group of electronic circuit units connected to the connecting line. Table 2 below illustrates an activation/deactivation of all eight electronic circuit units 101a-101h by means of the master bit 110 (Bit1) being set to a logic "1" level. The states of the select signal 103a-103h that are designated by "x" in Table 2 are insignificant in this case, i.e. it is unimportant what logic state the bits No. 2 to No. 5 of the bit sequence assume if the master bit 110 (Bit1) is activated.

Only an activated electronic circuit unit 101a-101h can receive, output and/or evaluate commands or data. The invention replaces the conventional static method of selecting/activating and deactivating electronic circuit units 101a-101n by a dynamic method that makes it possible to address specific electronic circuit units 101a-101n by means of serial data at a select signal input terminal 109 of the electronic memory module. An evaluation of the applied drive signals 103, 103a-103n leads to an activation or deactivation of the relevant electronic circuit unit 101a-101n.

TABLE 2

| Circuit unit | Bit sequence 108 | | | | |
|---|---|---|---|---|---|
| | Bit 1 Master bit 110 | Bit 2 | Bit 3 | Bit 4 | Bit 5 |
| 101a | 1 | x | x | x | x |
| 101b | 1 | x | x | x | x |
| 101c | 1 | x | x | x | x |
| 101d | 1 | x | x | x | x |
| 101e | 1 | x | x | x | x |
| 101f | 1 | x | x | x | x |
| 101g | 1 | x | x | x | x |
| 101h | 1 | x | x | x | x |

The master bit 110 of the bit sequence 108 of the select signal 103 is preferably the most significant bit of the bit sequence 108, i.e. the MSB.

As emerges from Table 2, it is also possible for only a predetermined group of electronic circuit units 101a-101n connected to the connecting line 106 to be jointly activated or deactivated.

An activation/deactivation cycle may be predetermined periodically by the circuit arrangement according to the invention, for example every four clock cycles. If no select signal is then applied to the electronic circuit module 100, all electronic circuit units 101a-101n of the circuit module 100 are deactivated in the preferred exemplary embodiment. When addressing eight electronic circuit units 101a-101n as are accommodated in a typical electronic circuit module 100 designed as a memory module, 4 bits, for example, are necessary, i.e. the connecting line 106 has to be designed as a 1-bit wide data bus.

The circuit arrangement according to the invention is advantageous particularly where many electronic circuit units 101a-101n have to be accommodated in a common electronic circuit module 100. In the case of stacked chips, in particular, it is advantageous that a dedicated drive line 104a-104n does not have to be provided to each individual chip from outside the circuit module 100. Preferably, a unique address is assigned in the case of each electronic circuit unit 101a-101n of the circuit module 100, which address can be obtained from the bit sequence 108 shown in Tables 1 and 2 above.

Figure 2:
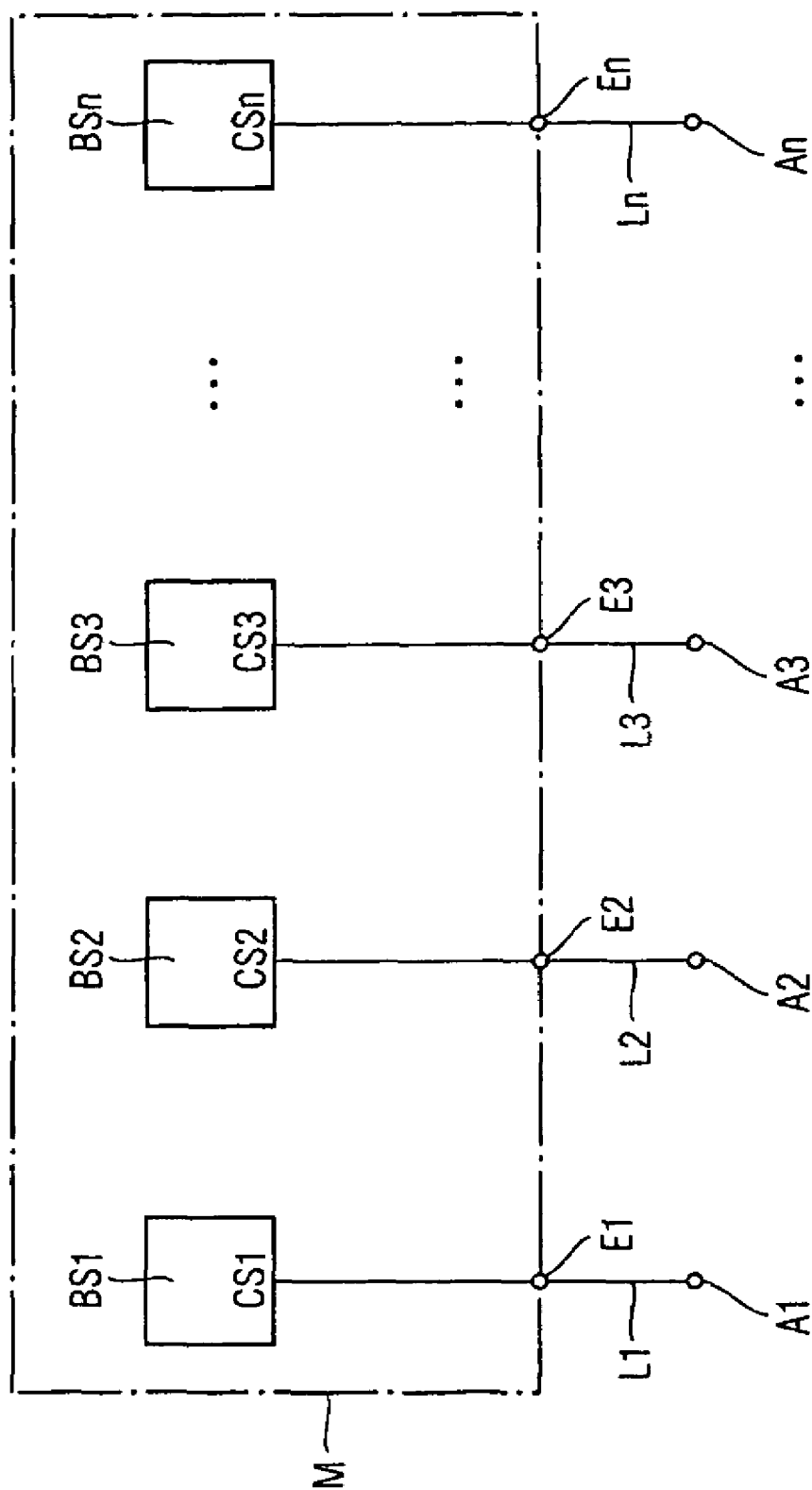
FIG. 2 shows a conventional circuit module with individual electronic chips.

With regard to the conventional circuit module with individual electronic chips as illustrated in FIG. 2, reference is made to the introduction to the description.

Although the present invention has been described above on the basis of preferred exemplary embodiments, it is not restricted thereto, but rather can be modified in diverse ways.

Moreover, the invention is not restricted to the application possibilities mentioned.

LIST OF REFERENCE SYMBOLS

In the figures, identical reference symbols designate identical or functionally identical components or steps.

100 Electronic circuit module
101a-101n Electronic circuit unit
102a-102n Control input terminal
103,
103a-103n Select signal
104a-104n Drive line
105 Select signal generating unit
106 Connecting line

107a-107n Decoder unit
108 Bit sequence
109 Select signal input terminal
110 Master bit

What is claimed is:

1. Electronic circuit arrangement, having:
   a) an electronic circuit module constructed from one or more electronic circuit units, the electronic circuit units in each case having:
   a1) a control input terminal for activating or deactivating the electronic circuit unit by means of a select signal; and
   a2) a drive line assigned to each electronic circuit unit and serving for feeding the select signal to each electronic circuit unit;
   b) a select signal generating unit for generating the select signal; and
   c) a connecting line for electrically connecting each electronic circuit unit to the select signal generating unit, wherein
   d) each of the electronic circuit units of the electronic circuit module furthermore in each case has a decoder unit for decoding a predetermined bit sequence of the select signal,
   e) at least one electronic circuit unit being selectively selected by means of the predetermined bit sequence of the select signal, and wherein
   f) the electronic circuit units of the electronic circuit module have a stacked construction and all or a predeterminable group of electronic circuit units connects to the connecting line are activated or deactivated jointly by means of a master bit of the bit sequence of the select signal.

2. Circuit arrangement according to claim 1, wherein the electronic circuit units of the electronic circuit module form a dynamic random access memory.

3. Circuit arrangement according to claim 1, wherein the connecting line is provided as a 1-bit wide data bus.

4. Method for activating and deactivating electronic circuit units arranged in an electronic circuit module wherein the electronic circuit units of the electronic circuit module have a stacked construction, the method having the following steps:
   a) generating, by means of a select signal generating unit, a select signal for selecting one or more electronic circuit units of the electronic circuit module;
   b) feeding the select signal, via a drive line assigned to each electronic circuit unit, to a control input terminal provided in each electronic circuit unit for activating or deactivating the electronic circuit unit, wherein
   c) the select signal for selecting one or more electronic circuit units of the electronic circuit module is fed to each electronic circuit unit by the select signal generating unit equally via a common connecting line; and
   d) a predetermined bit sequence of the select signal is decoded in each electronic circuit unit of the electronic circuit module by means of a decoder unit assigned to the electronic circuit unit, and
   e) selecting selectively at least one electronic circuit unit by means of the predetermined bit sequence of the select signal wherein all or a predetermined group of the electronic circuit units connected to the connecting line are activated or deactivated jointly by means of a master bit of the bit sequence of the select signal.

5. Method according to claim 4, wherein all or a predeterminable group of electronic circuit units connected to the connecting line are deactivated in the absence of the select signal.

6. Method according to claim 4, wherein each electronic circuit unit of the electronic circuit module that is to be activated or deactivated is assigned a unique address.

7. Method according to claim 4, wherein each of the electronic circuit units of the electronic circuit module undergoes transition to an active operating state only when it is fed a corresponding select signal.

8. Method according to claim 4, wherein an activation of an activated electronic circuit unit is maintained until a renewed activation or deactivation of the electronic circuit units of the electronic circuit module is effected by means of the select signal.

9. Method according to claim 4, wherein activation or deactivation operations of the electronic circuit units of the electronic circuit module are performed at time intervals that correspond to a predeterminable number of clock cycles.

10. Method according to claim 9, wherein the predetermined number of clock cycles is four.

11. Method according to claim 4, wherein when no select signal is applied to the select signal input terminal of the electronic circuit module, the entire electronic circuit module is deactivated.

* * * * *